United States Patent [19]

George

[11] Patent Number: 5,077,511
[45] Date of Patent: Dec. 31, 1991

[54] STEPPER MOTOR DRIVE FOR WAY FLOW END STATION

[75] Inventor: Gary T. George, Rocklin, Calif.
[73] Assignee: NEC Electronics, Inc., Mountain View, Calif.
[21] Appl. No.: 507,420
[22] Filed: Apr. 9, 1990
[51] Int. Cl.$^5$ .............................................. G05B 1/06
[52] U.S. Cl. .................................. 318/652; 250/492.3; 250/492.2; 204/298.25; 198/801; 318/696
[58] Field of Search ............................. 318/652, 696; 250/492.21, 492.3; 204/298.25; 198/801

[56] References Cited

U.S. PATENT DOCUMENTS

| | | | |
|---|---|---|---|
| 3,978,992 | 9/1976 | Mulzet et al. | 198/801 |
| 4,634,331 | 1/1987 | Hertel | 204/298.25 |
| 4,794,305 | 12/1988 | Matsukawa | 250/492.21 |
| 4,929,840 | 5/1990 | Dykstra et al. | 250/492.21 |

*Primary Examiner*—William M. Shoop, Jr.
*Assistant Examiner*—Saul M. Bergmann
*Attorney, Agent, or Firm*—Skjerven, Morrill, MacPherson, Franklin & Friel

[57] ABSTRACT

An apparatus is described which controls the movement and positioning of a platen on which wafers may be mounted. The apparatus comprises a stepper motor having a motor sprocket member operatively coupled to a platen by a drive mechanism. The drive mechanism comprises a chain which cooperates with the the stepper motor by engaging with the motor sprocket member. The drive mechanism also comprises a platen chain sprocket having a platen shaft member. The platen is movably connected to the platen shaft member. The chain cooperates with the platen by engaging with the platen chain sprocket. Operation of the stepper motor rotates the motor sprocket member and drives the drive mechanism, thereby rotating the platen chain sprocket and determining the movement and positioning of the platen. The apparatus is capable of controlled movement and positioning of the platen inside processing equipment, such as ion implantation equipment.

4 Claims, 7 Drawing Sheets

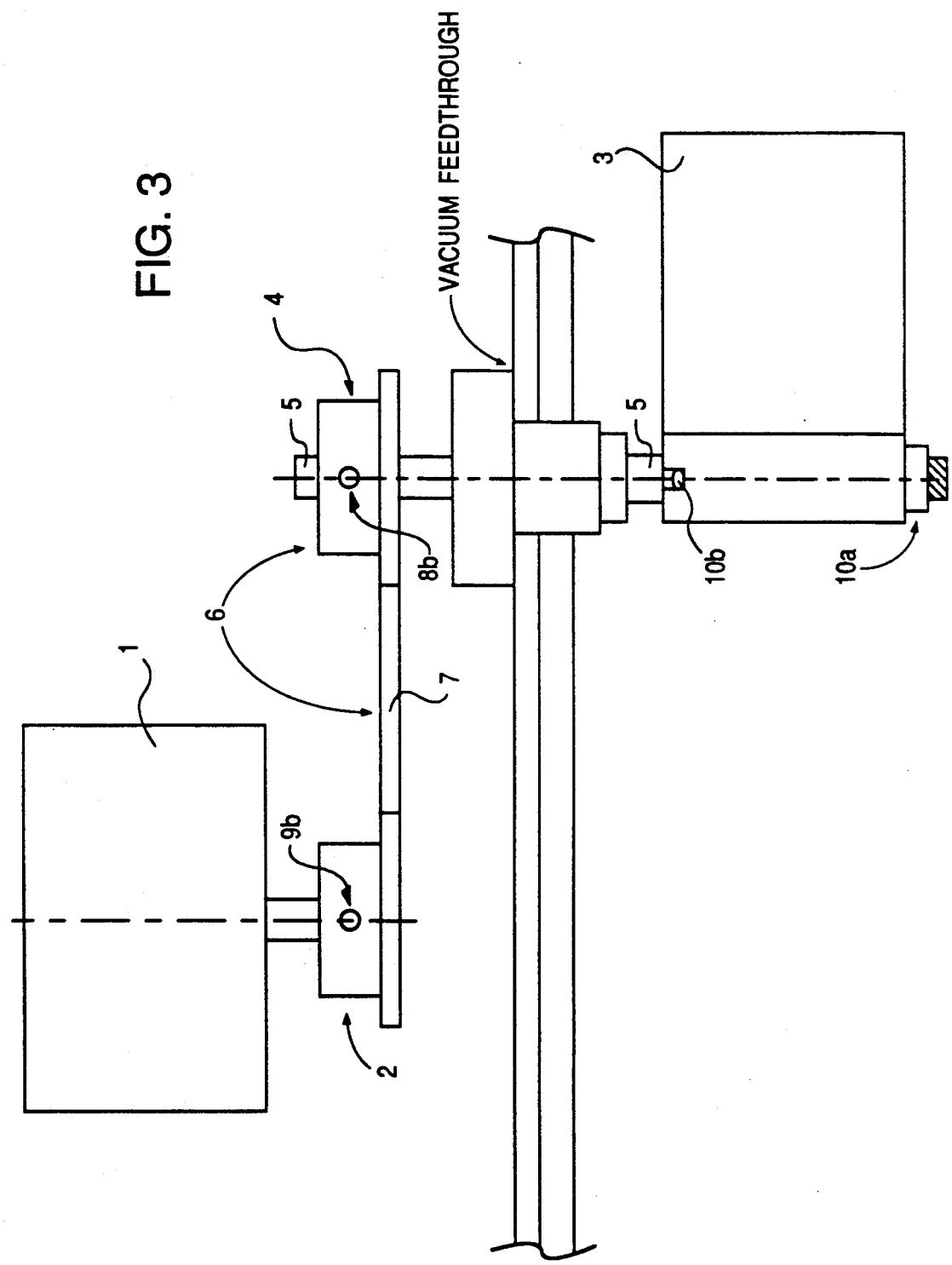

STEPPER MOTOR DRIVE FOR WAY FLOW END STATION

BACKGROUND OF THE INVENTION

1. Field of the Invention

This invention relates to means for controlling the movement and position of a platen on which a wafer may be mounted for use in process equipment such as that associated with ion implantation.

2. Description of the Prior Art

The conventional means for moving a platen uses air cylinders which drive gears to position the platen. The typical conventional means is illustrated in FIGS. 1A-C. The platen 15 is moved and positioned by the operation of the air cylinders 12, 13 which drive gears 20, 11. Gear 20 is cooperatively engaged with gear 11 and is fixably rotated by air cylinders 12, 13 by an interconnecting arm member 14. Interconnecting arm member 14 extends from air cylinder 13 and attaches to gear 20 by way of a shaft 17 and a clamp 19 (not shown). Platen 15 is attached to a shaft 16 by a clamp 18 (not shown) and is responsive to the cooperative movement of gears 20, 11. Air cylinders 12, 13 are connected in series to produce three fixed positions A-C. FIGS. 1A-C illustrate the three positions A-C of the series connected air cylinders. When cylinder 12 is in a full retract position while cylinder 13 is in a full extend position, as illustrated in FIG. 1A, the platen position is a wafer load position A. A wafer is loaded from a load lock 21 by gravity feed onto the platen. The platen moves to an implant position, which is approximately 0°-15° from the perpendicular. As illustrated in FIG. 1B, both air cylinders 12, 13 move into a full retract position to effect an implant position B of the platen. When the implantation process is completed, air cylinders 12, 13 both move into a full extend position which moves the platen into a wafer dump position C, as illustrated in FIG. 1C. The wafer is released from the platen and into the exit load lock 22.

Air cylinders characteristically have jerky and unpredictable movement and therefore provide less controllable movement of the platen. As a result, the cooperative movement of the air cylinders 12, 13 and gears 20, 11 do not control the movement and the positioning of platen 15 with the accuracy necessary for semiconductor processing, such as ion implantation. Positioning platen 15 is less predictable and inconsistent according to the conventional means because air cylinders 12, 13 do not stop at their full retract and full extend positions consistently. Moreover, clamp 19 which attaches air cylinder 13 to gear 20 and clamp 18 which attaches platen 15 to gear 11 of the conventional means are not hard-fixed to the assembly, but instead are friction type clamps which are operatively attached and detached with the gears. Therefore, clamps 18, 19 do not provide consistency to the conventional means of positioning a platen. Also, metal shielding is placed around platen 15 making visual verification of the platen's position difficult. This shielding makes it extremely difficult to check and set the alignment of platen 15 in relation to air cylinders 12, 13 and the gear train with clamps 18, 19. FIG. 2 illustrates the clamp 19 and bushing 19-1 design of the conventional means. This design is used to make a system with extremely high resistivity with respect to ground in order to allow the capture of ion charge. As illustrated in FIG. 2, platen 15 is located in the chamber under high vacuum and is hidden behind ion and x-ray shielding (not shown). In order to adjust the platen position or work on the platen, the vacuum chamber must be vented to the atmosphere. Venting of the chamber requires approximately 20 minutes evacuation time, but repumping the chamber to vacuum takes about 4 hours. Therefore, platen positioning is accomplished according to a more tedious but faster method which requires at least experience. In order to check the dump (FIG. 1C) and load (FIG. 1A) positions of platen 15, cylinders 12, 13 are placed in their proper position and the platen 15 positions are visually checked with the aid of a wafer. The wafer's thickness is a conventional and arbitrary standard choosen as the gap width necessary to prevent wafers from hitting the platen or exit lock in FIGS. 1A and 1C, respectively. This gap worked well to estimate the positions of the platen 15 and the wafer helped visualize this gap width. The platen is adjusted by loosening shaft clamp 18 and visually and manually setting the implant position B with a protractor. At all times, the wafer yield during ion implantation is sensitive to the implant angle accuracy. Once the implant position is set, clamp 18 is tightened The dump and load positions C, A are adjusted with mechanical stop screws which limit the travel of the air cylinders. The mechanical stop screws have limited adjustment capability and as a result, the adjustments made are inaccurate. The wafers are subject to many defects including wafer breakage as a result of the limitations with the conventional means.

SUMMARY OF THE INVENTION

It is an object of this invention to provide a means for controlling the movement and positioning a platen in process equipment According to this invention, an apparatus is provided which moves and positions a platen on which a wafer may be mounted. The apparatus comprises a stepper motor having a motor chain sprocket operatively coupled to a platen by a drive mechanism. The operation of the stepper motor drives the drive mechanism and determines the movement and positioning of the platen. The apparatus is capable of controlled movement and positioning of the platen.

BRIEF DESCRIPTION OF THE DRAWINGS

FIG. 3 is a plan view of the present invention.

DETAILED DESCRIPTION OF THE INVENTION

Figure 1A:
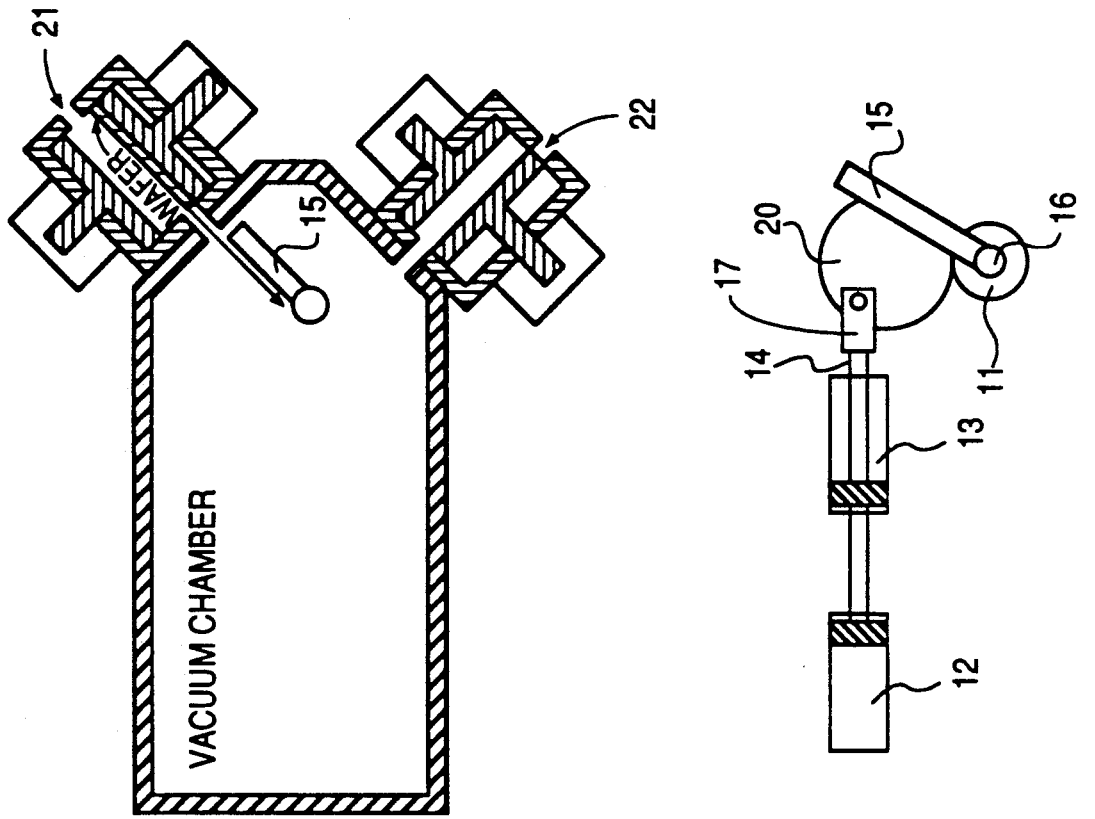
FIGS. 1A-C are plan views of a conventional platen drive means.
Figure 1B:
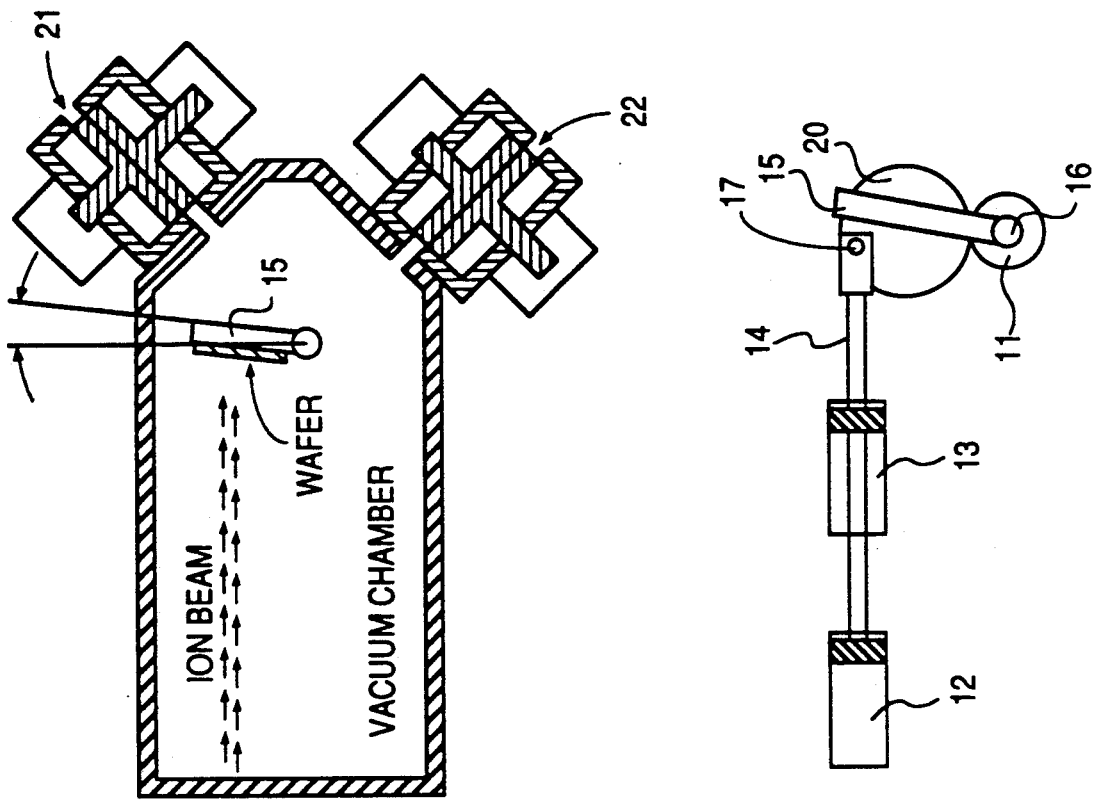
Figure 1C:
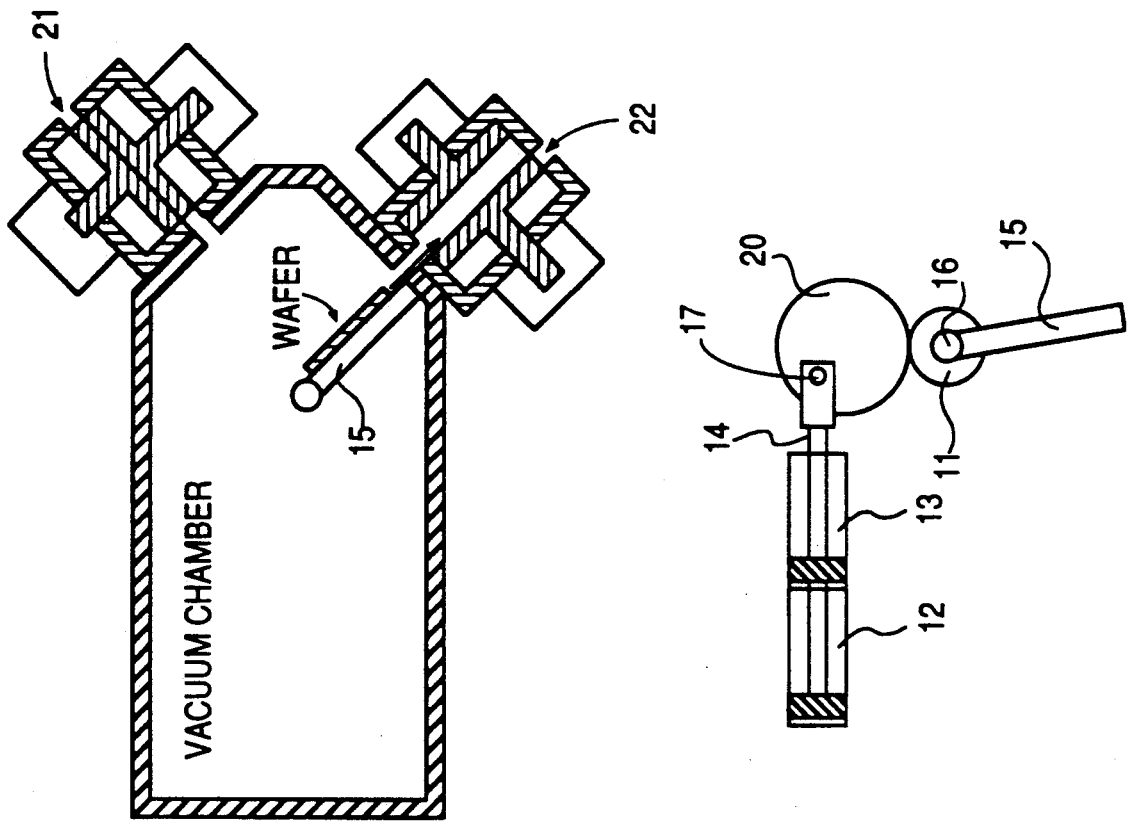
Figure 2:
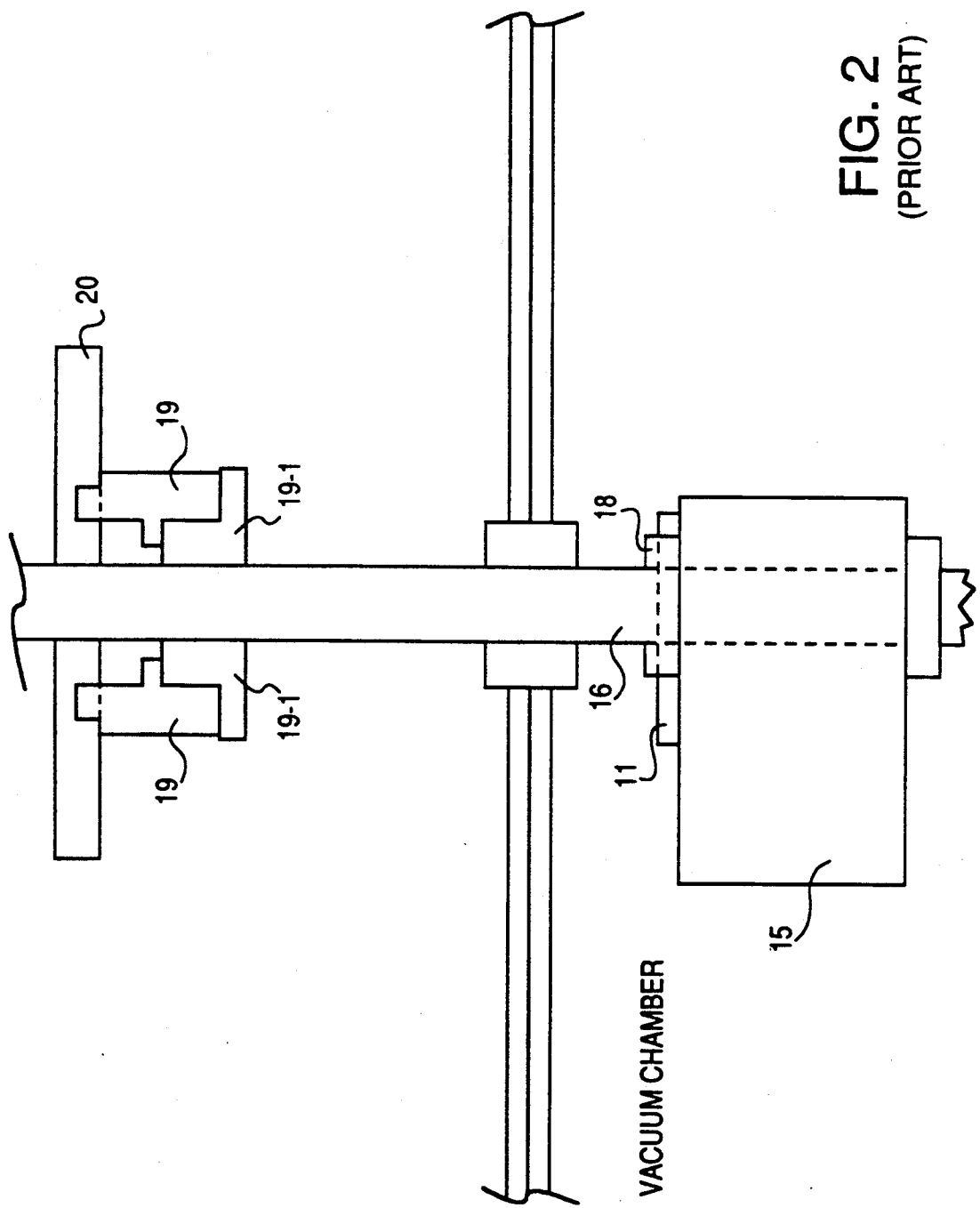
FIG. 2 is a view of the clamping mechanisms of the prior art.
Figure 4A:
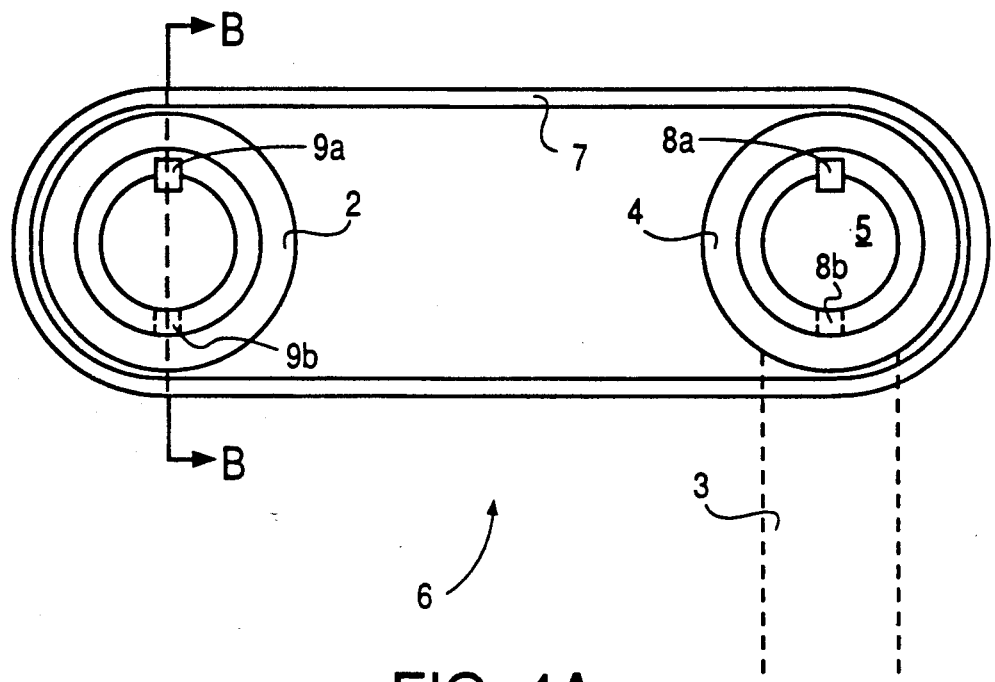
FIG. 4A is a detailed view of the drive means of FIG. 3.
Figure 4B:
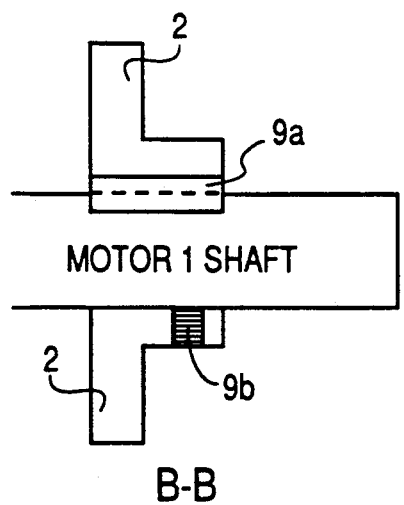
FIG. 4B is a sectional view of a keyed sprocket from FIG. 4A.
Figure 5A:
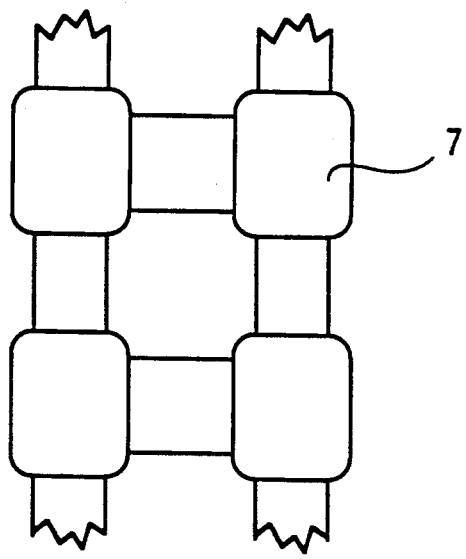
FIG. 5A is a front view illustrating the cable chain according to the present invention.
Figure 5B:
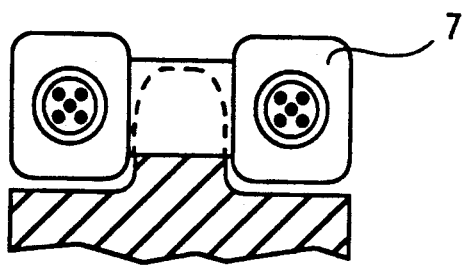
FIG. 5B is a cross-sectional view of the chain in FIG. 5A.

The preferred embodiment of this invention is illustrated in FIG. 3. A micro-stepping motor 1 is fixably connected to a motor chain sprocket 2. Motor chain sprocket 2 is preferably a keyed type sprocket which locks into place with locking key mechanism 9 comprising key 9a and set screw 9b, as illustrated in FIGS. 4A and 4B. Micro-stepping motor 1 is capable of 10,000 steps per revolution and achieves controllable micromanipulation of a platen 3 with the aid of a programmable micro-stepping controller. Stepping motor 1 is preferably a Computer size 42 motor AX 106–205 two-phase hybrid permanent-magnet type 1.8° stepper motor. The programmable micro-stepping controller is an AX-drive which includes the indexer and power driver. Micro-stepping motor 1 is operatively coupled with platen 3 by a drive means 6. Drive means 6 comprises a chain 7 electrically isolated from micro-stepping motor 1 and platen 3. Chain 7 is preferably a cable-linked type chain MIN-E-Pitch from Winfred Berg, Inc., for example, insulated with a plastic coating, preferably polyurethane, as illustrated in FIGS. 5A and B. Drive means 6 further comprises a keyed-type platen chain sprocket 4 connected to a platen shaft 5, as illustrated in FIG. 4A. In one embodiment, platen chain sprocket 4 and platen shaft 5 are integrally connected. The keyed-type chain sprocket design 4 according to the preferred embodiment is attached to platen shaft 5 with a locking key mechanism 8 comprising 8a and set screw 8b that positions and locks platen shaft 5 and platen chain sprocket 4 into position accurately and consistently. Keyed-type chain sprocket 2 is attached to stepping motor 1 with a similar locking key mechanism 9. Platen 3 is movably connected to platen shaft 5 and locked to shaft 5 with a nut 10a and pin 10b, as illustrated in FIG. 3. Chain 7 operatively engages motor chain sprocket 2 and platen chain sprocket 4 for providing cooperative movement between motor chain sprocket 2 and platen 3. Micro-stepping motor 1 causes motor chain sprocket 2 to rotate which moves drive means 6. Movement of drive means 6 moves platen 3 by cooperative rotation of platen chain sprocket 4 and platen shaft 5. As a result, drive means 6 according to the present invention cooperatively connects platen 3 and stepper motor 1 with a positive minimal-backlash drive. Drive means 6 moves platen 3 precisely according to the same angle as stepping motor 1 rotates.

The programmable step micro-stepping controller is preprogrammed to the exact load, implant, and dump positions A, B, and C, respectively. The controller produces a number of pulses which step the stepper motor 1 to the corresponding angle associated with positions A-C of platen 3. This controller repeatedly and accurately produces the number of pulses when one of several inputs is triggered from a master programmable controller such as a General Electric Series One PLC. The positioning of platen 3 will be consistent with the accurate and repeatable number of pulses produced by the programmable micro-stepping controller. Each incremental movement of drive means 6 causes controlled movement of platen 3 so that platen 3 and the wafer mounted thereon are positioned accurately for subsequent processing. The movement driven by micro-stepping motor 1 and controlled by micro-stepping controller do not exhibit the problems described above for the air cylinders of the conventional means. The apparatus according to the present invention is more accurate and repeatable than a mechanical system like the conventional means. The accuracy and repeatability of the present invention is evident even though the present invention may need zeroing or rehoning if maintenance or malfunctions occur. Moreover, micro-stepping motor 1 is capable of controlling the positioning of platen 3 even after the platen containing a wafer is inserted into process equipment. Therefore the exact positioning of the platen after insertion is readily determinable. An added benefit is the flexibility and accuracy of the implant position which can be reset by changing the position programming without any disassembly. This flexibility and accuracy eliminate the defects including wafer breakage which were associated with the prior art and described above.

While the invention has been described in connection with several exemplary embodiments, it will be understood that many modifications will be apparent to those of ordinary skill in the art without going beyond the intended scope of this invention.

I claim:

1. An apparatus for positioning a moveable platen on which a wafer may be mounted for processing comprising:

a stepper motor having a motor sprocket member; and drive means operatively coupling the sprocket member to the platen so that movement of the sprocket member determines the movement and positioning of the platen.

2. An apparatus according to claim 1, wherein said drive means comprises a platen chain sprocket having a platen shaft member, and a chain electrically isolated from the stepper motor and the platen chain sprocket, the platen being movably connected to the platen shaft member, the chain operatively engaging the platen chain sprocket and the motor sprocket member and providing cooperation between the motor sprocket member and the platen.

3. An apparatus according to claim 2, wherein the chain comprises a cable-linked chain coated with an insulating plastic.

4. An apparatus according to claim 1, wherein the stepper motor is capable of 10,000 steps per revolution and micro manipulation of the platen.

* * * * *